United States Patent [19]

Kanagawa et al.

[11] Patent Number: 4,849,709
[45] Date of Patent: Jul. 18, 1989

[54] VARIABLE FREQUENCY CHARACTERISTIC CIRCUIT FOR A VEHICULAR SOUND DEVICE

[75] Inventors: Akira Kanagawa; Hiroshi Hattori, both of Saitama, Japan

[73] Assignee: Pioneer Electronic Corporation, Tokyo, Japan

[21] Appl. No.: 919,351

[22] Filed: Oct. 16, 1986

[30] Foreign Application Priority Data

Oct. 16, 1985 [JP] Japan ............................ 60-158313[U]

[51] Int. Cl.⁴ ............................ H03F 3/45; H03F 1/36
[52] U.S. Cl. ............................ 330/259; 330/107
[58] Field of Search ............... 330/107, 109, 252, 259, 330/260, 261

[56] References Cited

U.S. PATENT DOCUMENTS 4,553,103  11/1985  Rollett ............................ 330/107

*Primary Examiner*—Gene Wan
*Attorney, Agent, or Firm*—Sughrue, Mion, Zinn, Macpeak & Seas

[57] ABSTRACT

A variable frequency characteristic circuit to be used in compensating the frequency characteristics in an audio device in a vehicle. A single operational amplifier is used. Different resonance circuits of different frequencies are connected from ground to either the inverting or non-inverting inputs in order to provide local peaks and dips. Two variable resistors are connected in parallel between the inverting and non-inverting inputs. Different resonance circuits of different frequencies are connected from ground to center taps of the variable resistors to provide treble and base control.

6 Claims, 2 Drawing Sheets

VARIABLE FREQUENCY CHARACTERISTIC CIRCUIT FOR A VEHICULAR SOUND DEVICE

BACKGROUND OF THE INVENTION

This invention relates to a variable frequency characteristic circuit for a vehicular acoustic device.

Acoustic characteristics inside a vehicle are different from those in the general sound field and have unique patterns because the sound field is surrounded by reflective surfaces such as window glass and a dashboard and by sound absorbing surfaces such as seats. Furthermore, the space of the sound field is narrow unlike the more normal home or office. For instance, the front seats are located roughly in the center of the longitudinal direction of the vehicle with sound sources (speakers) respectively arranged in both front doors. The resultant sound pressures has a frequency characteristic that peaks at about 250 Hz and 1-2 kHz and in which a dip occurs at about 700 Hz.

However excellent are the characteristics that a speaker unit has in an anechoic room, it is impossible to obtain a flat frequency characteristic from such a speaker unit installed in a vehicle. To compensate this disturbance, the frequency characteristics have conventionally been corrected by inserting a variable frequency characteristic circuit in the reproducing system of a vehicular acoustic device. Moreover, a sound quality adjusting circuit for adjusting the sound quality is also normally inserted in the reproducing system of the acoustic device.

FIG. 5 shows a circuit diagram of a conventional acoustic adjusting circuit and a variable frequency characteristic circuit. In FIG. 5, there is shown a buffer amplifier 1 formed with an operational amplifier $OP_1$ receiving an input signal as a non-inverted input. In a sound quality adjusting circuit 4, a resistor $R_1$, a variable resistor $VR_1$, and a capacitor $C_1$, are connected in series between the output of the operational amplifier $OP_1$ and ground. A resistor $R_2$ is connected in parallel across the variable resistor $VR_1$ Capacitors $C_2$, and $C_3$ are respectively connected from both ends of the variable resistor $VR_1$ and its slider (output). These elements constitute a resonance circuit 2 for adjusting the bass sound quality (low frequency sound). Moreover, a resistor $R_3$, a capacitor $C_4$, a variable resistor $VR_2$, a capacitor $C_5$ and a resistor $R_4$ are connected in series between the output of the operational amplifier $OP_1$ and ground. These elements constitute a resonance circuit 3 for adjusting the treble (high frequency sound). The sliders of variable resistors $VR_1$ and $VR_2$ are connected through resistors $R_5$ and $R_6$ and the contact common to them is grounded through resistors $R_7$ and $R_8$ and a capacitor $C_6$. The contact common to the resistors $R_7$ and $R_8$ is connected to the inverted input of the operational amplifier $OP_1$. The sound quality of the bass and treble are respectively adjusted by the variable resistors $VR_1$ and $VR_2$ in the sound quality adjusting circuit 4 thus arranged.

The output signal of the sound quality adjusting circuit 4 is applied through a resistor $R_9$ to the non-inverted input of another operational amplifier $OP_2$. The operational amplifier $OP_2$ and a feedback resistor $R_{10}$ connected between the output and inverted input of the operational amplifier $OP_2$ constitute a buffer amplifier 5. Resonance circuits 6 and 7 whose resonance frequencies are different from each other are connected between the non-inverted input of the operational amplifier $OP_2$ and ground through damping resistors $R_{11}$ and $R_{12}$, whereas a resonance circuit 8 is connected between the inverted input of the operational amplifier $OP_2$ and ground through a damping resistor $R_{13}$. There results a variable frequency characteristic variable circuit 9 for correcting the transmission frequency characteristics inside a vehicle.

Since the sound quality adjusting circuit 4 and the frequency characteristic variable circuit 9 each have their own separate buffer amplifiers, as described above, the combined circuit is disadvantageous in being not only costly but also handicapped in view of acoustic performance. That is the signal-to-noise ratio (S/N) and the distortion factor are degraded because two buffer amplifiers are inserted on the signal line.

SUMMARY OF THE INVENTION

The present invention has been made in view of the above problems, and it is therefore an object of the invention to provide a variable frequency characteristic circuit for use in a vehicular acoustic device designed to improve acoustic performance and to reduce cost.

The frequency characteristic variable circuit for a vehicular acoustic device according to the present invention comprises a single buffer amplifier inserted in a signal line. A plurality of resonance circuits correct the vehicular transmission frequency characteristics and a plurality of resonance circuits adjust the sound quality to provide both sound field correcting and sound quality adjusting functions.

DETAILED DESCRIPTION OF THE PREFERRED EMBODIMENTS

Referring now to the accompanying drawings, an embodiment of the present invention will be described in detail.

Figure 1:
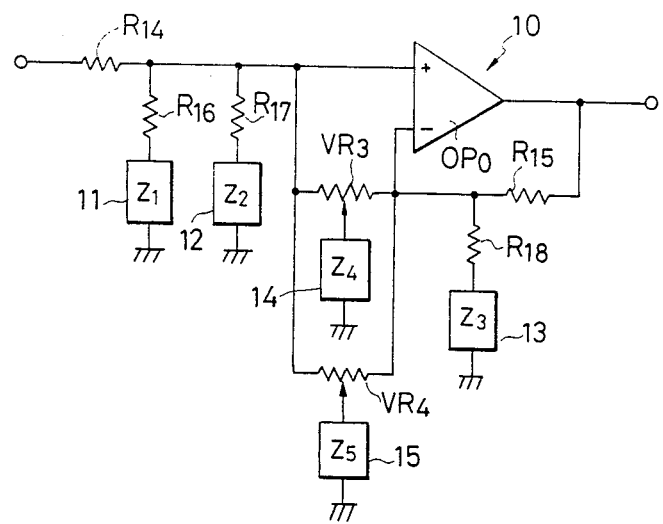
FIG. 1 is a circuit diagram showing an embodiment of the present invention.
Figure 5:
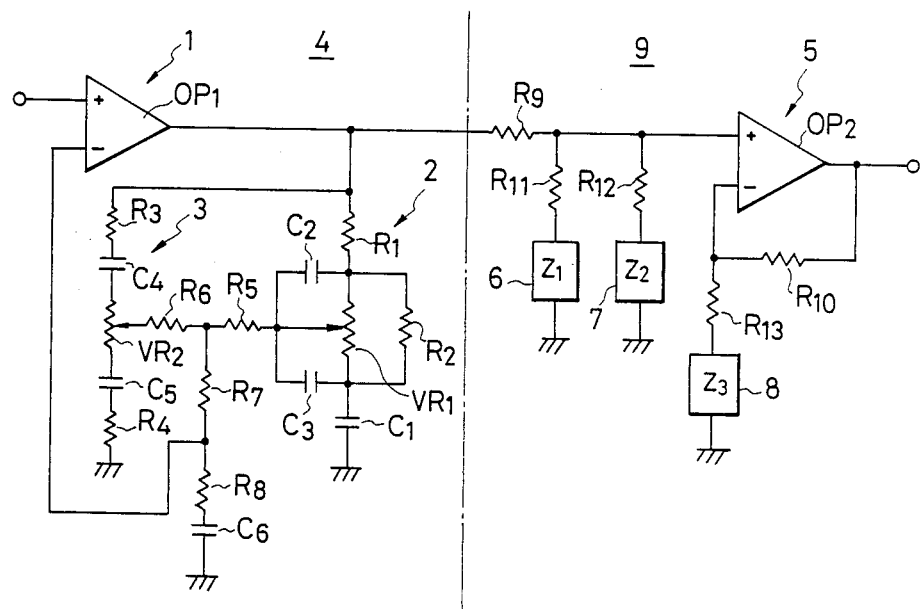
FIG. 5 is a circuit diagram showing a conventional variable circuit.
Figure 2:
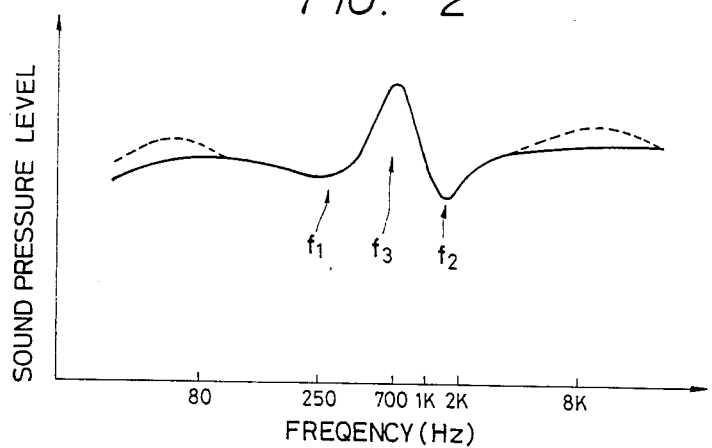
FIG. 2 is the frequency characteristic diagram of the circuit of FIG. 1.
Figure 3:
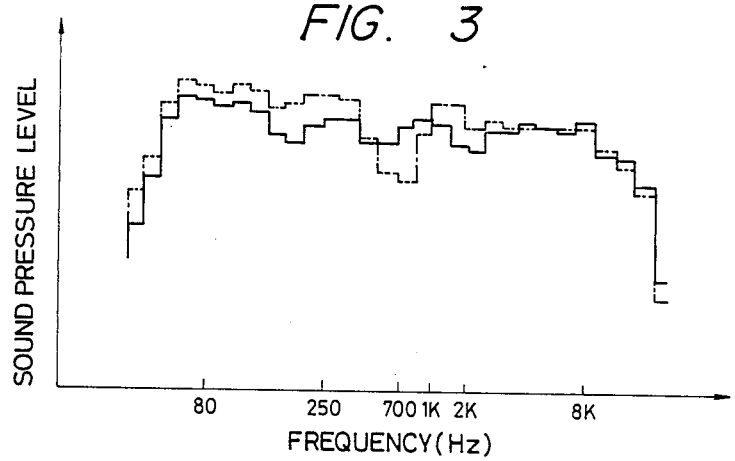
FIG. 3 shows the frequency characteristic diagrams inside a vehicle before correction (alternately long and short dash line) and after correction (continuous line).
Figure 4:
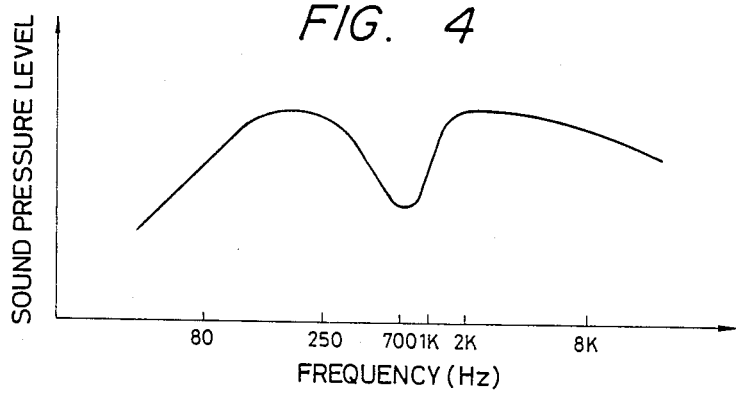
FIG. 4 is the frequency characteristic diagram inside a vehicle at the front seats when sound sources are arranged in front doors.

FIG. 1 is a circuit diagram embodying the present invention. In FIG. 1, an input signal is applied to an operational amplifier $OP_0$ as a non-inverted input through a resistor $R_{14}$. The operational amplifier $OP_0$ and a feedback resistor $R_{15}$ connected between the output and the inverted input of the operational amplifier $OP_0$ constitute a buffer amplifier 10. Resonance circuits 11 and 12 whose resonance frequencies are different from each other are connected between the non-inverted input of the operational amplifier $OP_0$ and ground (reference potential) through respective damping resistors $R_{16}$ and $R_{17}$. By a resonance circuit is meant a circuit, such as an LC circuit, having a minimum impedance at the resonance frequency. A resonance circuit 13 is connected between the inverted input of the operational amplifier $OP_0$ and ground through a damping resistor $R_{18}$. The circuit impedance and thus the resonant frequency of each of the resonance circuits 11-13 and the resistance of each of the resistors $R_{16}$-$R_{18}$ are fixed. If the resonance frequencies of the respective resonance circuits 11-13 are denoted by $f_1$, $f_2$ and $f_3$ and the corresponding resonance sharpness by $Q_1$, $Q_2$ and $Q_3$, then exemplary values are about 250 kHz for $f_1$, 1 to 2 kHz for $f_2$, about 700 Hz for $f_3$, 1 to 4 for Q, and 3-7 for both $Q_2$ and $Q_3$. However. it is not necessary that $Q_2$ equal $Q_3$. As a result, fixed frequency characteristics inside the vehicle are obtained, as shown in FIG. 2, with dips at $f_1$ and $f_2$ and a peak at $f_3$. This same characteristic is represented by an inverted curve of the transmission frequency characteristics shown in FIG. 4. In consequence, the peaks and dips of the transmission frequency characteristics inside the vehicle before correction as shown by a alternately long and short dash line in FIG. 3 are corrected by the resonance circuits 11-13 as shown by a continuous line in FIG. 3.

Additionally, variable resistors $VR_3$ and $VR_4$ are connected in parallel between the non-inverted and inverted inputs of the operational amplifier $OP_0$ and resonance circuits 14 and 15 whose resonance frequencies are different from each other are connected between the outputs (sliders) of the respective variable resistors $VR_3$ and $VR_4$ and ground (reference potential). If the resonance frequencies of the resonance circuits 14 and 15 are denoted by $f_4$ and $f_5$ and the corresponding resonance sharpness by $Q_4$ and $Q_5$, then exemplary values are about 80 Hz for $f_4$, about 8 KHz for $f_5$ and between 0.5 and 1 for $Q_4$ and $Q_5$, both being equal with these values, a low frequency can be boosted, cut or made flat by the variable resistor $VR_3$, whereas a high frequency can be boosted, cut or made flat likewise by the variable resistor $VR_4$. In other words, bass and treble sound quality is controllable by the variable resistors $VR_3$ and $VR_4$.

The resonance circuit 11 or 12 may be omitted depending on the car model or limitation of cost.

At the present time, a variable frequency characteristic circuit having five resonance circuits is employed for a vehicular sound device, as described above. Reference has been made to the use of three resonance circuits for the correction of the sound field and of the other two resonance circuits for adjusting sound quality in the above embodiment. However. another embodiment may be employed having two resonance circuits for the correction of the sound field and three resonance circuits for adjusting sound quality. Further, two additional resonance circuits may be connected between the operational amplifier and ground and, by setting the resonance frequencies at about 50 Hz and 10 kHz, the frequency characteristics shown by a broken line of FIG. 2 are obtainable.

In the above embodiment, moreover, two resonance circuits for adjusting sound quality were used to deal with two ranges of sound, bass and treble, three resonance circuits may be used to comply with three ranges of sound, bass, mid-range and treble. Although the resistance of the disclosed variable resistor is changeable continuously, the variable resistance may be allowed to change discontinuously using a switch and, by preparing combinations of such resistors, they may be made to function as a tone selector.

Although a description was given of a case where the transmission frequency characteristics at the front seats were corrected in such acoustic conditions in which sound sources (speakers) were arranged in both left and right front doors, the peaks and dips of the transmission frequency characteristics at the rear seats may also be corrected by setting the circuit constant of each resonance circuit in such a manner as to make obtainable frequency characteristics represented by an inverse curve relative to the transmission frequency characteristics involved because the transmission frequency characteristics at the rear seats are different in terms of acoustic conditions.

In the case of employing a variable frequency characteristic circuit having more than six resonance circuits, each of the resonance circuits may, as appropriate, be distributed among the circuits for the correction of the sound field and the circuits for adjusting sound quality.

As set forth above, only a single buffer amplifier is inserted in the signal line in accordance with the variable frequency characteristic circuit of the present invention. Because one buffer amplifier can be dispensed with, as compared with the conventional variable circuits, acoustic performance including the S/N, distortion factor, separation and the like is improved, whereas production costs become reducible. If the circuit is formed as an IC (Integrated Circuit). the space required for its installation may also be minimized.

What is claimed is:

1. A variable frequency characteristic circuit for an acoustic device, comprising:
    a buffer amplifier formed with a negative feedback amplifier, receiving an audio input signal on one of a non-inverting input terminal and an providing an audio output signal on an output terminal;
    a first resonance circuit connected between said non-inverting input terminal and a reference potential and having a first resonance frequency;
    a second resonance circuit connected between said inverting input terminal and said reference potential and having a second resonance frequency different from said first resonance frequency;
    a first variable resistor connected between said inverting and non-inverting input terminals and having a variable tap;
    a third resonance circuit connected between said tap of said first variable resistor and said reference potential and having a third resonance frequency.

2. A variable frequency characteristic circuit as recited in claim 1, wherein said buffer amplifier receives said audio input input signal on said non-inverting input terminal.

3. A variable frequency characteristic circuit as recited in claim 1, further comprising:
    a second variable resistor connected in parallel to said first variable resistor between said inverting and non-inverting input terminals and having a variable tap; and
    a fourth resonance circuit connected between said variable tap of said second variable resistor and said reference potential and having a fourth resonance frequency different from said third resonance frequency.

4. A variable frequency characteristic circuit as recited in claim 2, further comprising:
    a second variable resistor connected in parallel to said first variable resistor between said inverting and non-inverting input terminals and having a variable tap; and
    a fourth resonance circuit connected between said variable tap of said second variable resistor and said reference potential and having a fourth resonance frequency different from said third resonance frequency.

5. A variable frequency characteristic circuit as recited in claim 4, further comprising a fifth resonance circuit connected between said non-inverting input terminal and said reference potential and having a fifth resonance frequency different from said first and second resonance frequencies.

6. A variable frequency characteristic circuit as recited in claim 5, wherein said second resonance frequency is between said first and fifth resonance frequencies.

* * * * *